United States Patent
Lin et al.

(10) Patent No.: US 8,093,649 B2
(45) Date of Patent: Jan. 10, 2012

(54) FLASH MEMORY CELL

(75) Inventors: Chrong-Jung Lin, Hsinchu (TW);
Ya-Chin King, Taipei (TW)

(73) Assignee: National Tsing Hua University, Hsinchu (TW)

( * ) Notice: Subject to any disclaimer, the term of this patent is extended or adjusted under 35 U.S.C. 154(b) by 31 days.

(21) Appl. No.: 12/408,933

(22) Filed: Mar. 23, 2009

(65) Prior Publication Data
US 2009/0242959 A1   Oct. 1, 2009

Related U.S. Application Data

(60) Provisional application No. 61/040,253, filed on Mar. 28, 2008.

(51) Int. Cl.
*H01L 29/788* (2006.01)
(52) U.S. Cl. ............ 257/319; 257/E29.3; 257/314
(58) Field of Classification Search .......... 257/316–319, 257/E29.3, E21.682, E27.103
See application file for complete search history.

(56) References Cited

U.S. PATENT DOCUMENTS

| | | | |
|---|---|---|---|
| 5,029,130 A | | 7/1991 | Yeh |
| 5,301,150 A * | | 4/1994 | Sullivan et al. .......... 365/185.08 |
| 6,528,839 B2 * | | 3/2003 | Shukuri et al. ................ 257/314 |
| 6,747,310 B2 | | 6/2004 | Fan et al. |
| 7,170,137 B2 * | | 1/2007 | Yasutake et al. .............. 257/365 |
| 2008/0105917 A1 * | | 5/2008 | Hsieh et al. .................. 257/316 |
| 2009/0039407 A1 * | | 2/2009 | Vora ............................ 257/316 |
| 2009/0267127 A1 * | | 10/2009 | Chen et al. .................... 257/314 |

OTHER PUBLICATIONS

Shih, et al.; "High Program Efficiency of P-Type Floating Gate in N-Channel Split-Gate Embedded Flash Memory" Applied Physics Letters vol. 93 Issue: 21 Article No. 213503 , Nov. 24, 2008.

* cited by examiner

*Primary Examiner* — Victor A Mandala
*Assistant Examiner* — Whitney T Moore
(74) *Attorney, Agent, or Firm* — Thomas, Kayden, Horstemeyer & Risley, LLP

(57) ABSTRACT

A flash memory cell includes a substrate, a source, a drain, a first oxide, a second oxide, a floating gate and a control gate. The source and a drain are formed in the substrate separately, and are doped with N-type ions. The first oxide is formed on the substrate. The floating gate is formed on the first oxide, wherein the floating gate is doped with P-type ions. The second oxide formed on the floating gate. The control gate formed on the second oxide.

4 Claims, 4 Drawing Sheets

FLASH MEMORY CELL

CROSS-REFERENCE TO RELATED APPLICATION

This application claims the priority benefit of U.S. Provisional Application Ser. No. 61/040,253, filed Mar. 28, 2008, the full disclosures of which are incorporated herein by reference.

BACKGROUND

1. Field of Invention

The present invention relates to a scalable semiconductor memory device. More particularly, the present invention relates to a flash memory cell.

2. Description of Related Art

The split-gate flash memory is used in standalone and embedded nonvolatile memory because of the advantages of fast erase speed, high programming efficiency, and most important, no verification after program and erase. The erase is achieved through sharp poly tip by means of field-enhanced Fowler-Norheim (F-N) tunneling, and the program is accomplished by source-side hot carrier injection (SSI).

However, there are some problems for the conventional split-gate flash memory about the program disturb, such as the punch-through disturb, the reverse tunneling disturb, the row punch-through disturb or the like. The root cause of program-disturb is verified to relate to a large source voltage in the programming operation.

In view of the foregoing, there is a need in the related field to provide a new flash memory cell to prevent above-mentioned program disturb worse.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one or more aspects, the present disclosure is directed to a flash memory cell.

In accordance with an embodiment of the present disclosure, the flash memory cell comprises a substrate, a source, a drain, a first oxide, a second oxide, a floating gate and a control gate. The source and a drain are formed in the substrate separately. The first oxide is formed on the substrate. The floating gate is formed on the first oxide, wherein the floating gate is heavily doped with P-type ions. The second oxide formed on the floating gate. The control gate formed on the second oxide.

In accordance with another embodiment of the present disclosure, the flash memory cell comprises a substrate, a source, a drain, a floating gate, a control gate and a select gate. The source and a drain are formed in the substrate separately. The floating gate is disposed above the substrate, wherein the floating gate is heavily doped with P-type ions. The control gate is stacked above the floating gate. The select gate is positioned to the side of both the floating gate and the control gate.

In accordance with another embodiment of the present disclosure, the flash memory cell comprises a substrate, a source, at least two drains, at least two floating gates, at least two control gates, an erase gate and at least two select gates. The source and the drains are formed in the substrate separately, wherein the source is disposed between the drains. The floating gates are disposed on opposite sides of the source respectively. The control gates disposed on the floating gates respectively and on opposite sides of the source, wherein the floating gate is heavily doped with P-type ions. The erase gate is disposed directly above the source and between the control gates. The select gates formed on the sides of both the control gates and the floating gates opposite the erase gate.

Many of the attendant features will be more readily appreciated, as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Like reference numerals are used to designate like parts in the accompanying drawings.

DESCRIPTION OF THE PREFERRED EMBODIMENTS

Figure 1:
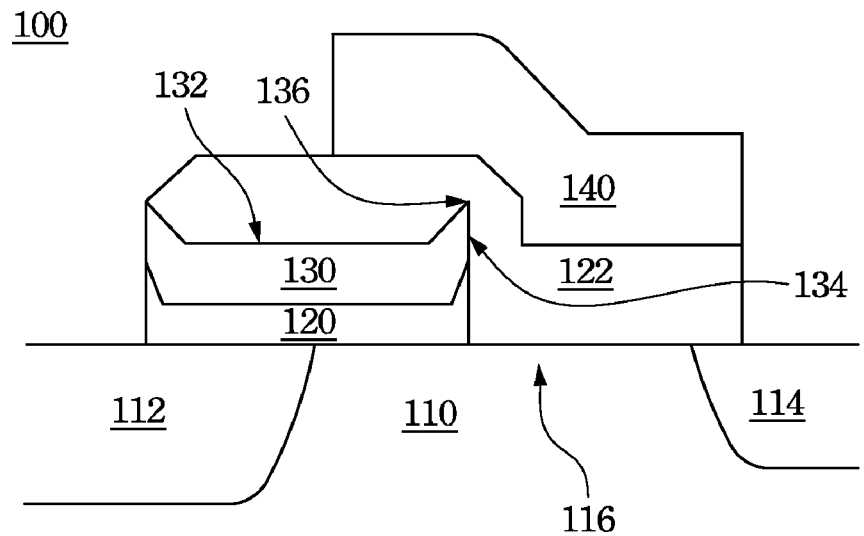
FIG. 1 is a cross-sectional view of a flash memory cell according to an embodiment of the present disclosure.

Reference will now be made in detail to the present preferred embodiments of the invention, examples of which are illustrated in the accompanying drawings. Wherever possible, the same reference numbers are used in the drawings and the description to refer to the same or like parts.

Please refer to FIG. 1. FIG. 1 is a cross-sectional view of a flash memory cell 100 according to an embodiment of the present disclosure. In FIG. 1, the flash memory cell 100 comprises a substrate 110, a source 112, a drain 114, a first oxide 120, a floating gate 130, a second oxide 122 and a control gate 140. The source 112 and the drain 114 are formed in the substrate 110 separately. The first oxide 120 is formed on the substrate 110. The floating gate 130 is formed on the first oxide 120. The second oxide 122 is formed on the floating gate 130. The control gate 140 is formed on the second oxide 122.

The flash memory cell 100 comprises a channel region 116. The channel region 116 in the substrate 110 is disposed between the source 112 and the drain 114. The floating gate 130 is located above a part of the channel region 116. The floating gate 130 has a curved top surface 132 that is depressed at the center of the curved top surface 132; the floating gate 130 has at least one sidewall 134 that intersects the curved top surface 132 to form a sharp edge 136. The second oxide 122 covers the sharp edge 136 and the sidewall 134 of the floating gate 130. The control gate 140 is over the substrate 110 and covers a part of the floating gate 130, including the sharp edge 136 of the floating gate 130.

The substrate 110 is doped with P-type ions, and the floating gate 130 is heavily doped with P-type ions; on the contrary, the control gate 140 is heavily doped with N-type ions, and the source 112 and the drain 114 are also heavily doped with N-type ions.

Figure 2:
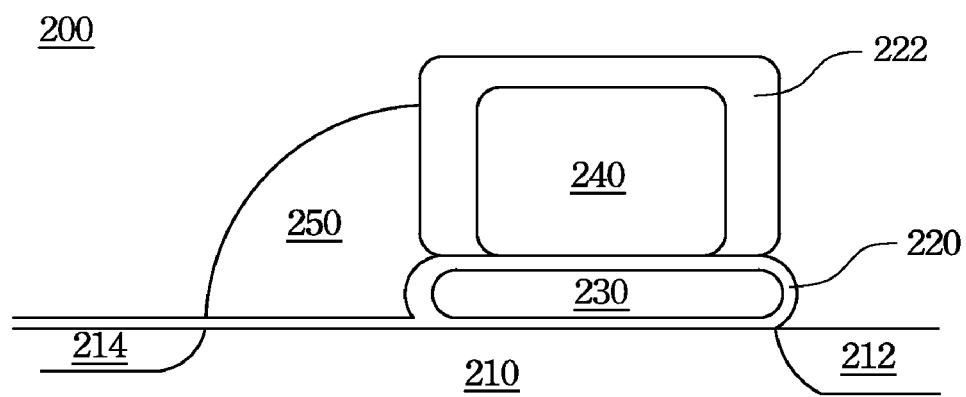
FIG. 2 is a cross-sectional view of a flash memory cell according to another embodiment of the present disclosure.

Please refer to FIG. 2. FIG. 2 is a cross-sectional view of a flash memory cell 200 according to another embodiment of the present disclosure. In FIG. 2, the flash memory cell 200 comprises a substrate 210, a source 212, a drain 214, a floating gate 230, a control gate 240 and a select gate 250. The source 212 and the drain 214 are formed in the substrate 210 separately. The floating gate 230 is disposed above the substrate 210. The control gate 240 is stacked above the floating gate 230. The select gate 250 is positioned to the side of both the floating gate 230 and the control gate 240.

The flash memory cell 200 comprises a first oxide 220 and a second oxide 222. The floating gate is disposed over the substrate 210. The first oxide 220 on the substrate 210 surrounds the floating gate 230 and extends under the select gate 250. The second oxide 222 on the floating gate 230 surrounds the control gate 240.

The substrate 210 is doped with P-type ions, and the floating gate 230 is heavily doped with P-type ions; on the contrary, the select gate 250 is heavily doped with N-type ions, and the source 212 and the drain 214 are also heavily doped with N-type ions.

Figure 3:
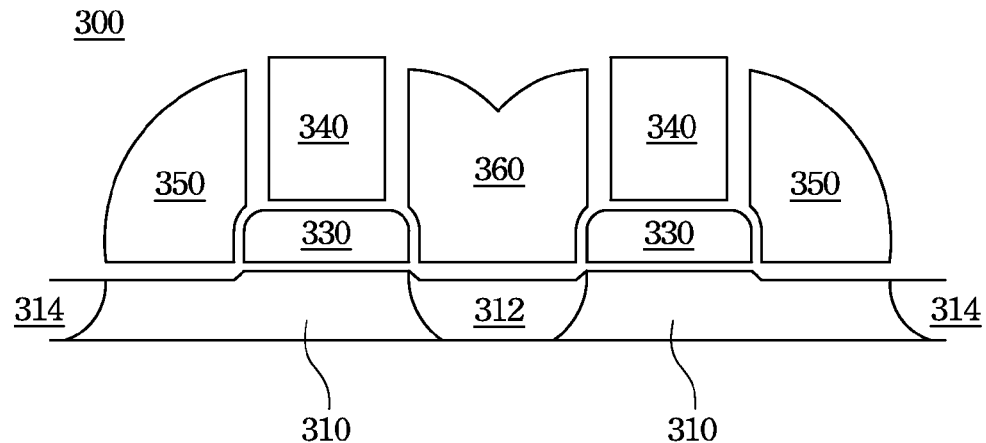
FIG. 3 is a cross-sectional view of a flash memory cell 300 according to another embodiment of the present disclosure.

Please refer to FIG. 3. FIG. 3 is a cross-sectional view of a flash memory cell 300 according to another embodiment of the present disclosure. In FIG. 3, the flash memory cell 300 comprises a substrate 310, a source 312, two drains 314, two floating gates 330, two control gates 340, two select gates 350 and an erase gate 360. The source 312 and the drains 314 are formed in the substrate 310 separately, wherein the source 312 is disposed between the drains 314. There are vertically stacked pairs of floating gates 330 and control gates 340 on opposite sides of the source 312. The floating gates 330 are disposed on opposite sides of the source 312 respectively, and the control gates 340 are disposed on the floating gates 330 respectively and on opposite sides of the source 312. The erase gate 360 is disposed directly above the source 312 and between the stacked gates 330, 340. The select gates 350 are formed on the sides of the stacked gates 330, 340 opposite the erase gate 360.

Moreover, the flash memory cell 300 may comprises oxide (not shown). The oxide is disposed among the substrate 310, the floating gates 330, the control gates 340, the select gates 350 and the erase gate 360.

The substrate 310 is doped with P-type ions, and the floating gates 330 are heavily doped with P-type ions; on the contrary, the select gates 350 are heavily doped with N-type ions, and the source 312 and the drains 314 are also heavily doped with N-type ions. In other words, the source 312 is a N-type source, and the drains 314 are N-type drains.

Figure 4:
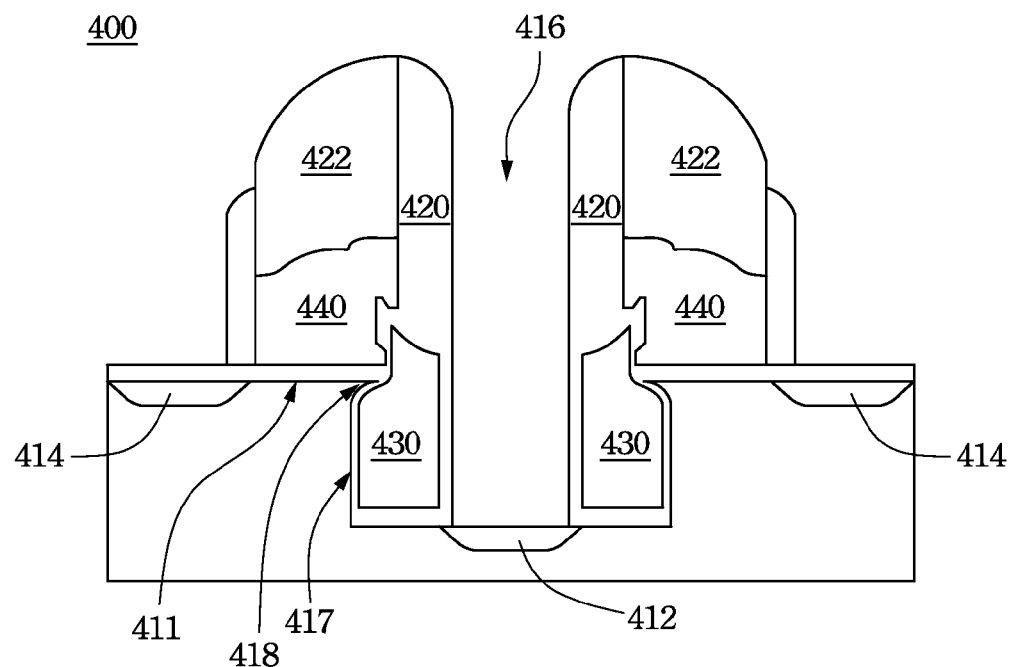
FIG. 4 is a cross-sectional view of a flash memory cell according to another embodiment of the present disclosure.

Please refer to FIG. 4. FIG. 4 is a cross-sectional view of a flash memory cell according to another embodiment of the present disclosure. In FIG. 4, the flash memory cell 400 comprises a substrate 410, a source 412, two drains 414, a trench 416, a first oxide 420, a floating gate 430, a second oxide 422 and a control gate 440. The substrate 410 has a surface 411. The trench 416 is formed in the substrate 410. The trench 416 has a sidewall 417 that meets the surface 411 to form a sharp edge 418. The source 412 and the drains 414 are formed in the substrate 410 separately, wherein the source 412 is disposed between the drains 414. The source 412 is disposed underneath the trench 416; the drains 414 are disposed on opposite sides of the trench 416. The floating gate 430 is disposed in the trench 416 adjacent to the sidewall 417 of trench 416. The control gate 440 is disposed over the substrate 410.

The floating gate 430 and the control gate 440 is insulated from the substrate 410. The control gate 440 may be stacked gates.

The flash memory cell 400 comprises a first oxide 420 and a second oxide 422. The first oxide 420 surrounds the floating gate 430. The second oxide 422 is disposed on the control gate 440; the first oxide 420 extends on the side of both the control gate 440 and the second oxide 422.

Moreover, The flash memory cell 400 may comprise poly blocks and tungsten/titanium-nitride. The poly blocks are formed in the trench 416. The tungsten/titanium-nitride is formed in the trench 416 and is disposed on the poly blocks.

The substrate 410 is doped with P-type ions, and the floating gates 430 are heavily doped with P-type ions; on the contrary, the control gate 440 is heavily doped with N-type ions, and the source 412 and the drains 414 are also heavily doped with N-type ions.

Figure 5:
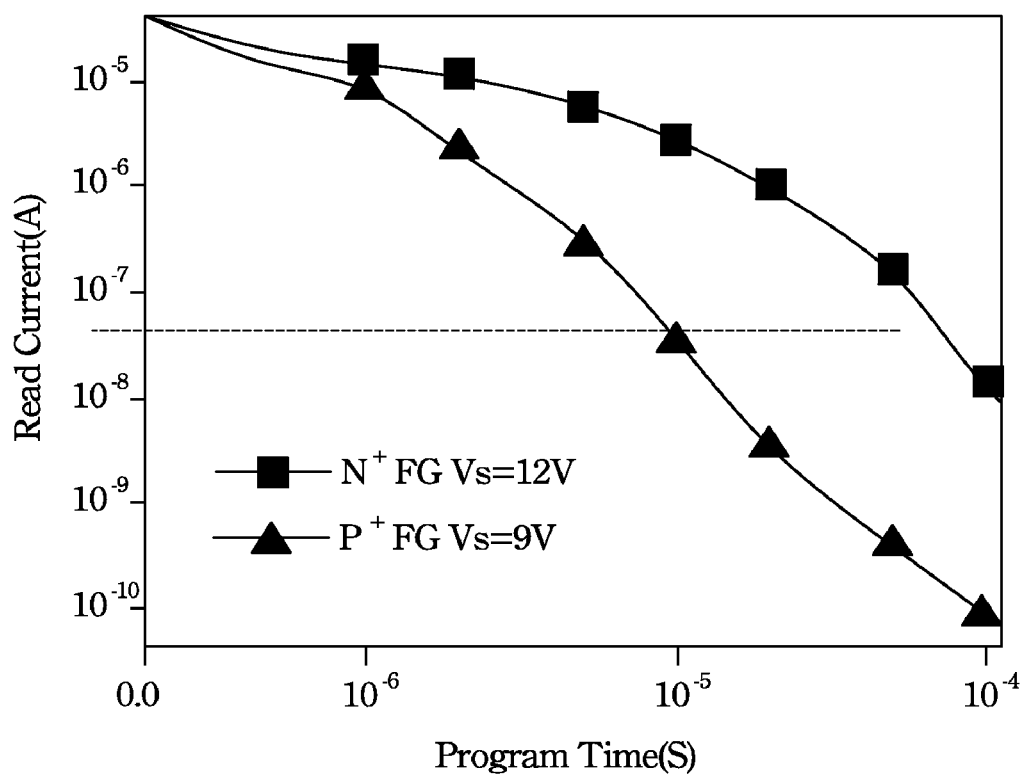
FIG. 5 is a graph depicting one or more aspects of the present disclosure.

For a more complete understanding of the present invention, and the advantages thereof, please refer to FIG. 5. FIG. 5 is a graph depicting one or more aspects of the present disclosure. In FIG. 5, the floating gate heavily doped with P-type ions features much fast programming speed than the floating gate heavily doped with N-type ions. In the programming operation, even the rate of supplying 9V for the floating gate heavily doped with P-type ions is faster than the rate of supplying 12V for the floating gate heavily doped with N-type ions. It should be appreciate that the voltage could be greatly reduced by means of the floating gate heavily doped with P-type ions.

Figure 6A:
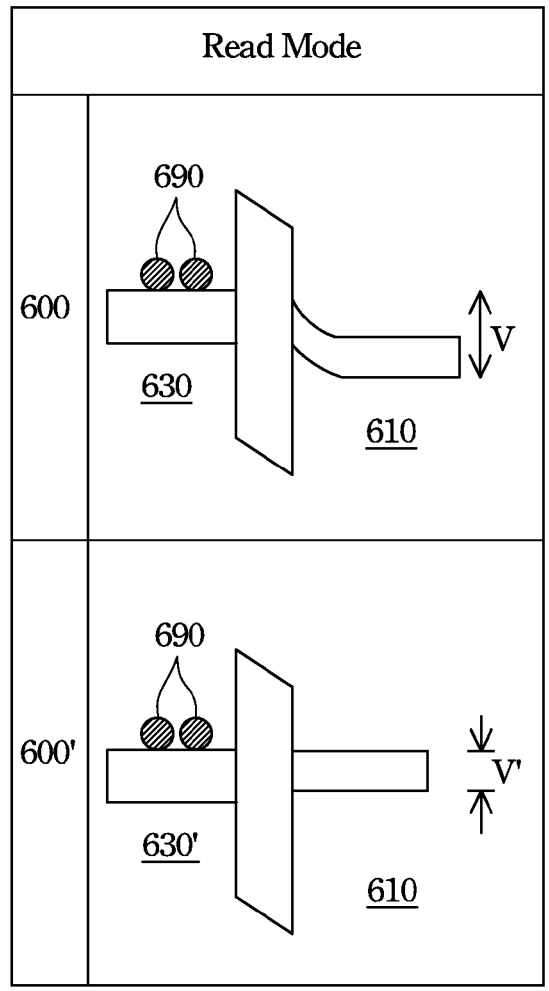
FIGS. 6A and 6B show each schematic diagram of energy levels of the flash memory cell in accordance with one or more aspects of the present disclosure.
Figure 6B:
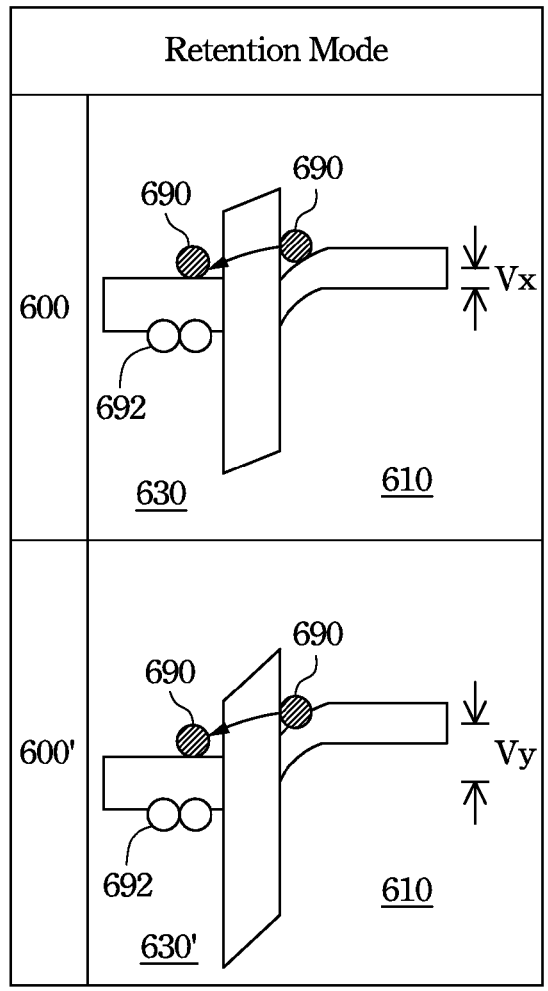

Furthermore, please refer to FIGS. 6A and 6B. FIGS. 6A and 6B show each schematic diagram of energy levels of the flash memory cell in accordance with one or more aspects of the present disclosure.

In FIG. 6A, the flash memory cells 600,600' are respectively operated in read mode after programmed. In structure, the flash memory cell 600 comprises a floating gate 630 heavily doped with P-type ions and a substrate 610 doped with P-type ions; for instance, the flash memory cell 600 may be the flash memory cell 100, the flash memory cell 200, the flash memory cell 300, the flash memory cell 400 or the like. The flash memory cell 600' is essentially the same as the flash memory cell 600, except that the floating gate 630 heavily doped with P-type ions is replaced with a floating gate 630' heavily doped with N-type ions. In Read Mode, when the same amount of electrons 690 are respectively stored in floating gates 630,630', the floating gate 630 heavily doped with P-type ions features higher threshold voltage V, and the floating gate 630' heavily doped with N-type ions features lower threshold voltage V'. Therefore, the read current in the floating gate 630 heavily doped with P-type ions must be less than that in the floating gate 630' heavily doped with N-type ions.

In FIG. 6B, in erase state of Retention Mode, holes 692 stored in the floating gate 630' heavily doped with N-type ions attract electrons 690 into the floating gate 630' due to the band gap difference issue (band gap $V_y$>band gap $V_x$), which may result in more severe charge gain, such that superior retention characteristics of holes 692 stored in the floating gate 630 heavily doped with P-type ions is better than in the floating gate 630' heavily doped with N-type ions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory cell comprising:
   a substrate having a surface;
   a trench formed in the substrate, wherein the trench has a sidewall that meets the surface to form a sharp edge;
   a source and two drains are formed in the substrate separately, wherein the source is disposed between the drains, wherein the source is disposed underneath the trench, and the drains are disposed on opposite sides of the trench, wherein the source and the drains are doped with N-type ions;
   a floating gate disposed in the trench adjacent to the sidewall of trench, wherein the floating gate is doped with P-type ions;
   a control gate disposed over the substrate;
   a first oxide surrounding the floating gate; and
   a second oxide disposed on the control gate, wherein the first oxide extends on the side of both the control gate and the second oxide.

2. The flash memory cell of claim 1, wherein the floating gate and the control gate are insulated from the substrate.

3. The flash memory cell of claim 1, wherein the control gate is heavily doped with N-type ions.

4. The flash memory cell of claim 1, wherein the substrate is doped with P-type ions.

\* \* \* \* \*